United States Patent [19]

Fujii

[11] Patent Number: 5,777,392

[45] Date of Patent: Jul. 7, 1998

[54] SEMICONDUCTOR DEVICE HAVING IMPROVED ALIGNMENT MARKS

[75] Inventor: Hideki Fujii, Tokyo, Japan

[73] Assignee: NEC Corporation, Tokyo, Japan

[21] Appl. No.: 623,638

[22] Filed: Mar. 28, 1996

[51] Int. Cl.$^6$ .................................................. H01L 23/544
[52] U.S. Cl. ............................ 257/797; 257/620; 356/401
[58] Field of Search ..................................... 257/620, 797

[56] References Cited

U.S. PATENT DOCUMENTS

| | | | |
|---|---|---|---|
| 4,642,672 | 2/1987 | Kitakata | 357/40 |
| 4,893,163 | 1/1990 | Rudeck | 357/40 |
| 4,981,529 | 1/1991 | Tsujita | 148/33 |
| 5,051,807 | 9/1991 | Morozumi | 357/40 |

*Primary Examiner*—Sara W. Crane
*Assistant Examiner*—Douglas A. Wille
*Attorney, Agent, or Firm*—Foley & Lardner

[57] ABSTRACT

In a semiconductor device including a plurality of chip areas arranged in a matrix and a grid-like scribe areas a plurality of L-shaped alignment segments and a plurality of pairs of I-shaped alignment segments are provided within the scribe area. Each of the L-shaped alignment segments is located within a first quadrant defined by an X direction center line and a Y direction center line of the scirbe area, and each pair of the I-shaped alignment segments is located within a second quadrant defined by the X direction center line and the Y direction center line adjacent to the first quadrant.

8 Claims, 24 Drawing Sheets

SEMICONDUCTOR DEVICE HAVING IMPROVED ALIGNMENT MARKS

BACKGROUND OF THE INVENTION

1. Field of the Invention

The present invention relates to a semiconductor device, and more particularly, to an improvement of alignment marks of a semiconductor device (or wafer).

2. Description of the Related Art

Generally, the same chip pattern is repetitively formed by an electron beam exposure apparatus on a wafer. In the formation of chip patterns, alignment marks are required. There are two kinds of alignment methods, i.e., a wafer alignment method and a chip alignment method.

In the wafer alignment method, several alignment marks, for example, five alignment marks on an upper-right portion, an upper-left portion, a lower-right portion, a lower-left portion, and a center portion of a wafer with respect to an orientation flat (so-called "orifla") are detected to statistically correct the location of all chips of the wafer. According to this wafer alignment method, since the number of alignment measurements is small, the alignment speed is high; however, a high precision of position control of a stage such as a smaller minimum resolution, a high repetition accuracy and a high precision of step feed are required.

In the chip alignment method, alignment marks of all the chips are detected to correct, the location of each chip in accordance with the detection of its corresponding alignment marks. Thus, a high precision of position control of a stage can be obtained; however, since the number of alignment measurements is large, the alignment speed is low.

The present invention is particularly related to a chip alignment method.

Also, there are three kinds of methods for detecting alignment marks.

In a first alignment detecting mentod, an alignment mark is scanned with light such as a laser beam, and reflected light is detected to calculate a center of the alignment mark.

In a second alignment detecting method, a plurality of alignment marks are irradiated with light, and an intensity of diffracted light from the alignment marks is detected to calculate a center of the alignment marks.

In a third alignment detecting method, an image of an alignment mark is compared with a stored image, to calculate a difference therebetween.

The present invention is particularly related to the first alignment detecting method.

Also, alignment marks may be provided within chip areas and within a scribe area partitioning the chip areas. If the alignment marks are provided within the chip areas, the integration is decreased. Contrary to this, if the alignment marks are provided within the scribe area, the integration is increased. Therefore, it is preferable to provide the alignment marks within the scribe area.

A first prior art semiconductor device (wafer) includes a plurality of chip areas arranged in rows and columns, a scribe area partitioning the chip areas, and a plurality of cross-type alignment marks arranged at intersections between center lines of the scribe area along an X direction and center lines of the scribe area along a Y direction. This will be explained later in detail.

In the first prior art semiconductor device, however, since the cross-type alignment marks of an outermost chip are lacking, chip alignment of the outermost chip has to be carried out by using cross-type alignment marks other than the lacking alignment mark, thus increasing the alignment time. Also, the accuracy of alignment for the outermost chip may be deteriorated.

A second prior art semiconductor device (wafer) includes a plurality of chip areas arranged in rows and colunms, a scribe area partitioning the chip areas, and a plurality of rectangular-strip-shaped alignment marks arranged at intersections between center lines of the scribe area along the X direction and center lines of the scribe area along the Y direction. This will be explained later in detail.

In the second prior art semiconductor devices however, since parts of the alignment marks remain after dicing of the scribe area, a short-circuit may occur between the remaining parts of the alignment marks and bonding wires.

SUMMARY OF THE INVENTION

It is an object of the present invention to provide a semiconductor device (wafer) capable of effectively performing an alignment method for outermost chips and avoiding a short-circuit between alignment marks and bonding wires.

According to the present invention, in a semiconductor device including a plurality of chip areas arranged in a matrix and a grid-like scribe area, a plurality of L-shaped alignment segments and a plurality of pairs of I-shaped alignment segments are provided within a dicing area within the scribe area. Each of the L-shaped alignment segments is located within a first quadrant defined by an X direction center line and a Y direction center line of the scribe area, and each pair of the I-shaped alignment segments are located within a second quadrant defined by the X direction center line and the Y direction center line adjacent to the first quadrant.

Also, if diffraction grating alignment segments are present in the proximity of intersections between the X direction center line and the Y direction center line, other pairs of I-shaped alignment segments are provided instead of the L-shaped alignment segments.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2, 3, 4A and 4B, 5, 6, 7, 8, 9A and 9B, and 10.

Figure 1:
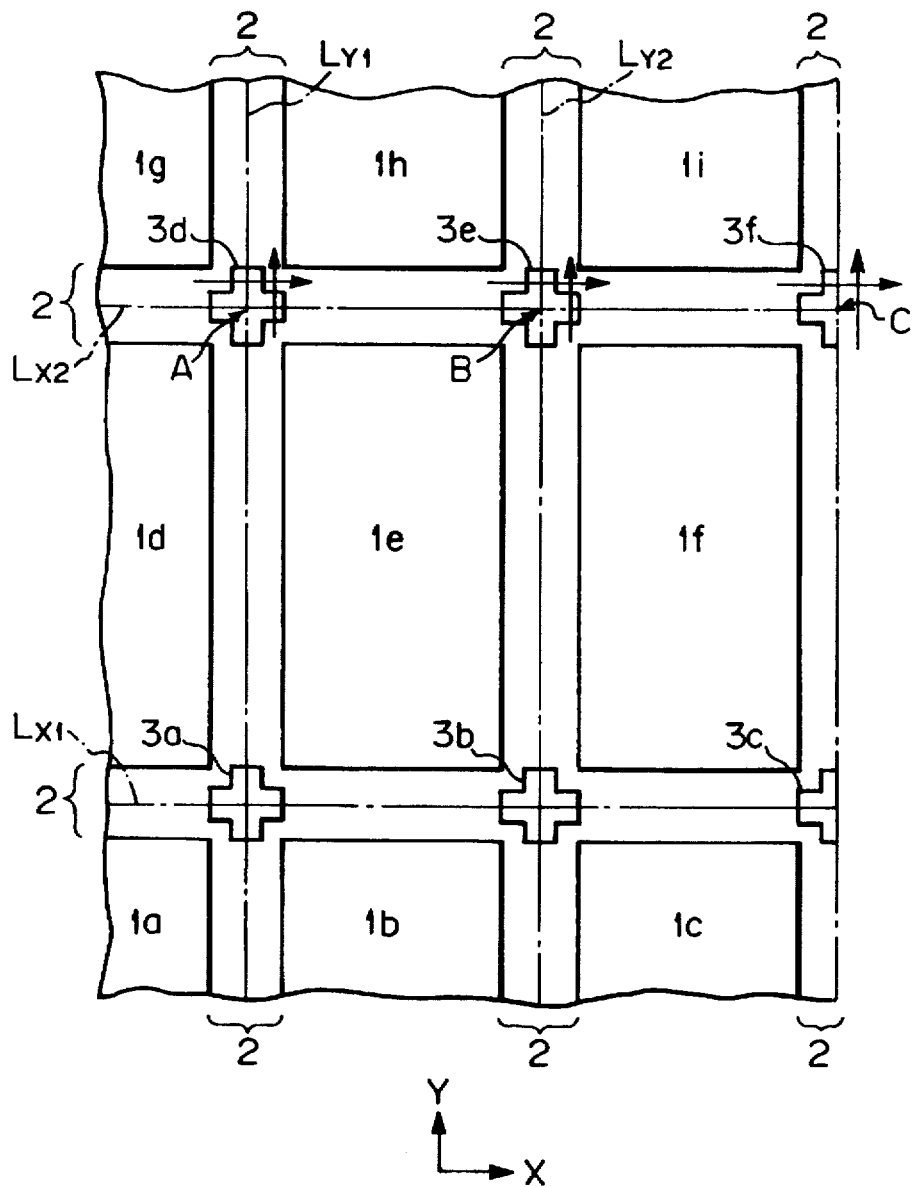
FIG. 1 is a layout diagram illustrating a first prior art semiconductor device.

In FIG. 1, which illustrates a first prior art semiconductor device (wafer), chip areas $1a$, $1b$, ..., $1h$ are arranged in a matrix along an X direction and along a Y direction. Also, a grid-shape scribe area 2 is formed to partition the chip areas $1a$, $1b$, ..., $1h$. Further, cross-type alignment marks $3a$, $3b$, ..., $3f$ are provided at intersections between center lines $L_{X1}$, $L_{X2}$, ... of the scribe area 2 along the X direction and center lines $L_{Y1}$, $L_{Y2}$, ... of the scribe area 2 along the Y direction.

A chip alignment for each chip is carried out by scanning two alignment marks with a laser beam. For example, a chip alignment for the chip are $1e$ is carried out as follows. First, the alignment mark $3d$ is scanned with the laser beam as indicated by an arrow along the X direction and as indicated by an arrow along the Y direction to obtain a location A of the alignment mark $3d$. Next, the alignment mark $3e$ is scanned with the laser beam as indicated by an arrow along the X direction and as indicated by an arrow along the Y direction to obtain a location B of the alignment mark $3d$. From comparison of the locations A and B with reference locations, an X direction deviation, a Y direction deviation and a gradient deviation of the chip area $1e$ can be obtained, and as a result, correction of deflection of an electron beam or the like can be carried out in accordance with the X direction deviation, the Y direction deviation and the gradient deviation.

Figure 2:
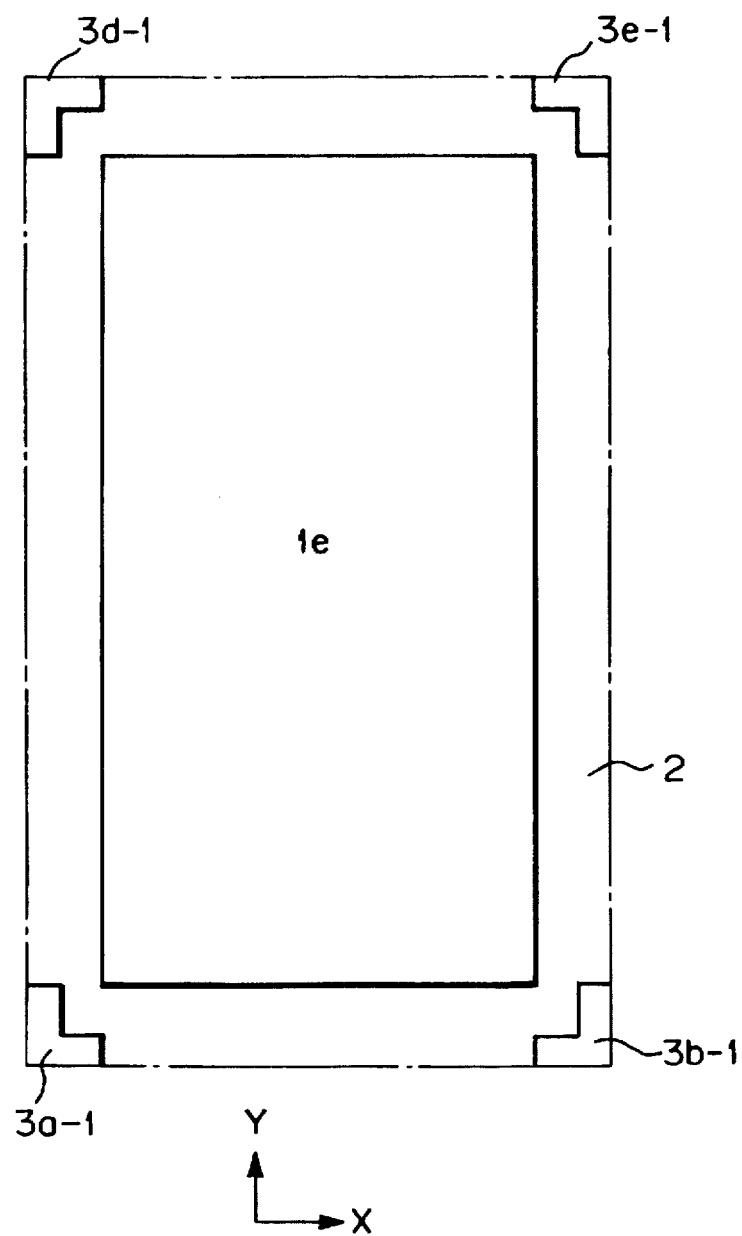
FIG. 2 is a layout diagram of one exposure unit of the device-of FIG. 1.

In FIG. 2, which illustrates one exposure unit of the device of FIG. 1, the exposure unit is comprised of one chip area such as $1e$ and four quadrantal segments of alignment marks such as a quadrantal segment $3a$-1 of the alignment mark $3a$, a quadrantal segment $3b$-1 of the alignment mark $3b$, a quadrantal segment $3d$-1 of the alignment mark $3d$, and a quadrantal segment $3e$-1 of the alignment mark $3e$.

Figure 3:
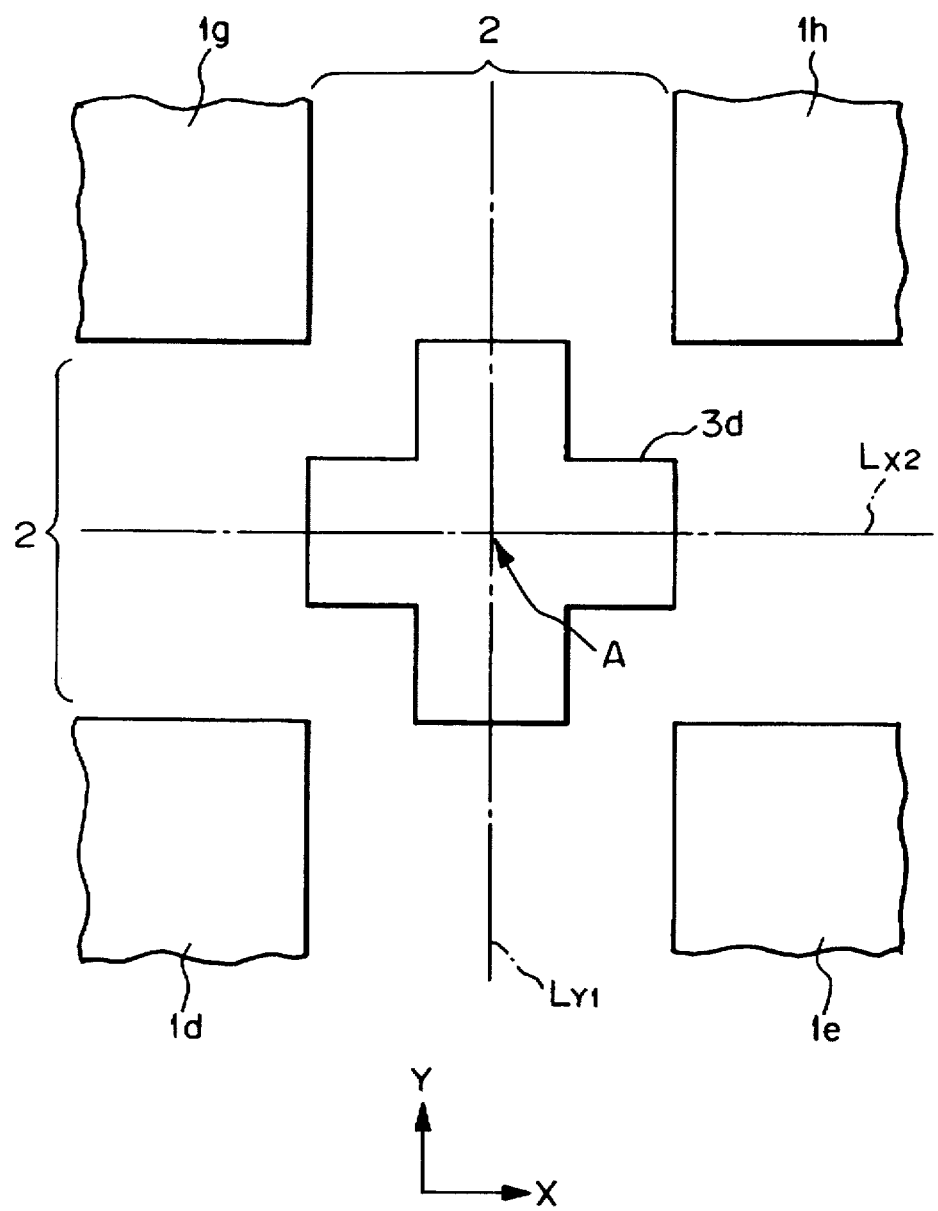
FIG. 3 is a partly-enlarged layout diagram of the alignment mark and its neighborhood of FIG. 1.
Figure 4A:
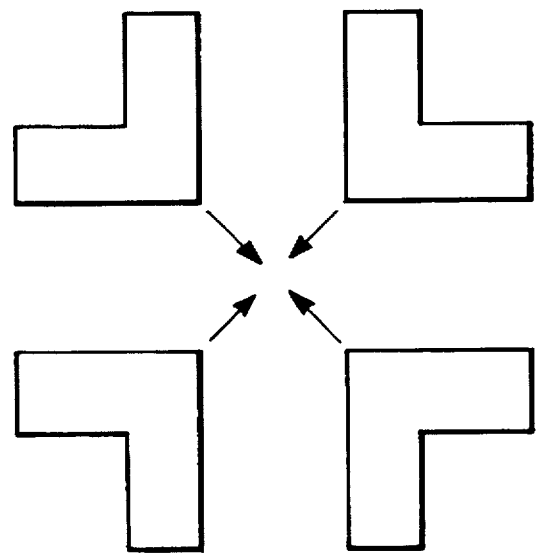
FIGS. 4A and 4B are diagrams for explaining the segments of the alignment of FIG. 3.
Figure 4B:
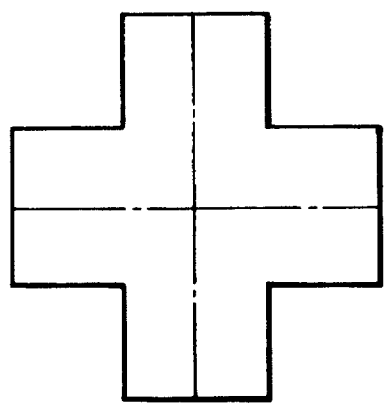

In FIG. 3, which is an enlarged diagram of one alignment mark such as $3d$ of FIG. 1, the alignment mark $3d$ is located at art intersection between the center line $L_{X2}$ and the center line $L_{Y1}$. The alignment mark $1d$ is formed by assembling four quadrantal segments as illustrated in FIG. 4A into one cross-type mark-as illustrated in FIG. 4B.

Figure 5:
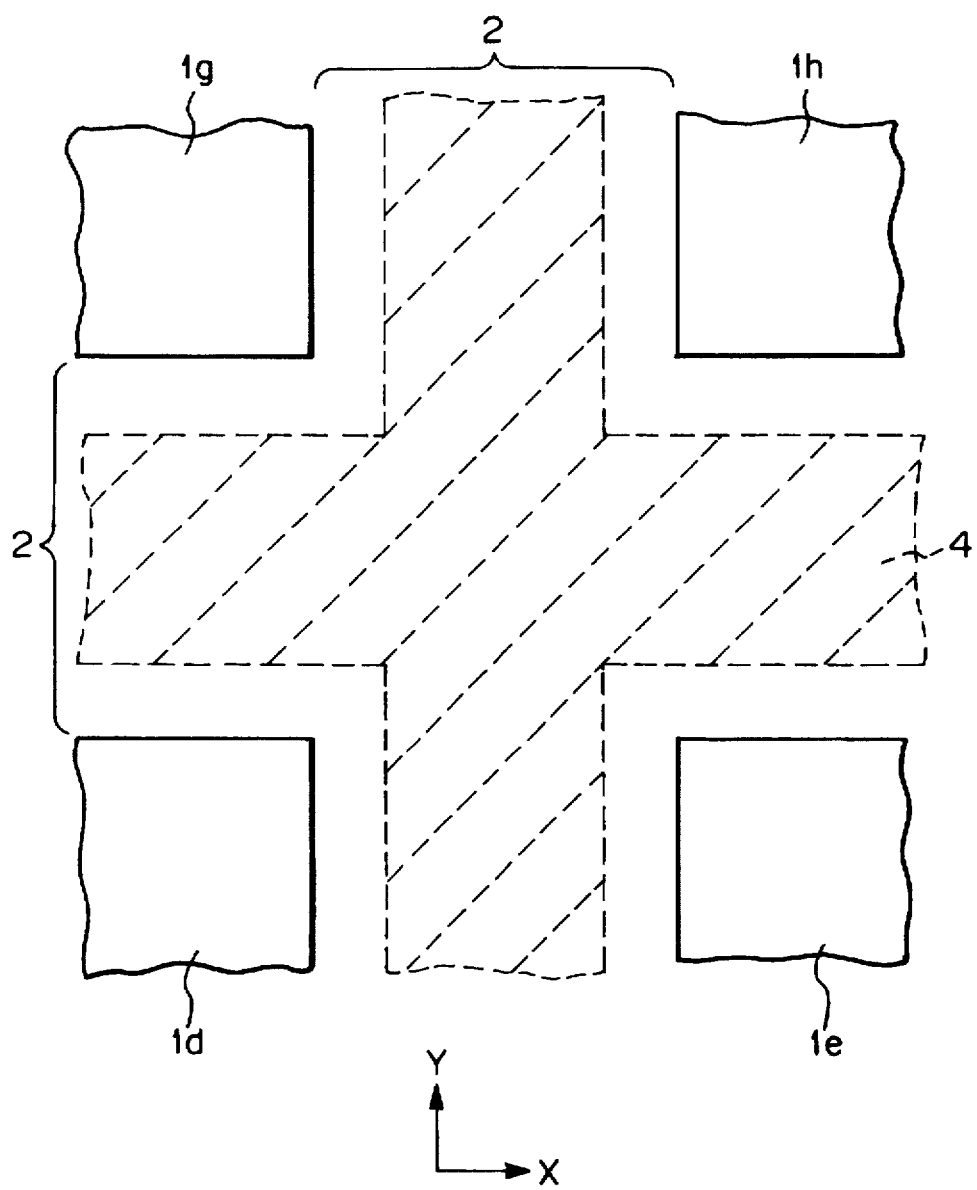
FIG. 5 is a layout diagram of the alignment mark and its neighborhood of FIG. 3 after a dicing operation is carried out.

In FIG. 5, which illustrates the device of FIG. 3 after a dicing operation is carried out, a dicing area 4 is removed, and accordingly, the alignment mark such as $3d$ of FIG. 3 is completely removed. Therefore, there is no anxiety about a short-circuit between the remaining parts of the alignment marks and bonding wires.

In the above-described prior art semiconductor device, however, in the outermost chip area such as $1f$ of FIG. 1, segments of the alignment mark $3f$ are lacking, so that it is impossible to calculate an accurate location of the alignment mark $3f$. Therefore, chip alignment of the outermost chip area such as if has to be carried out by using another alignment mark such as $3b$ instead of the lacking alignment mark $3f$. This increases the alignment time, and also, the accuracy of alignment for the outermost chip areas may be deteriorated.

Figure 6:
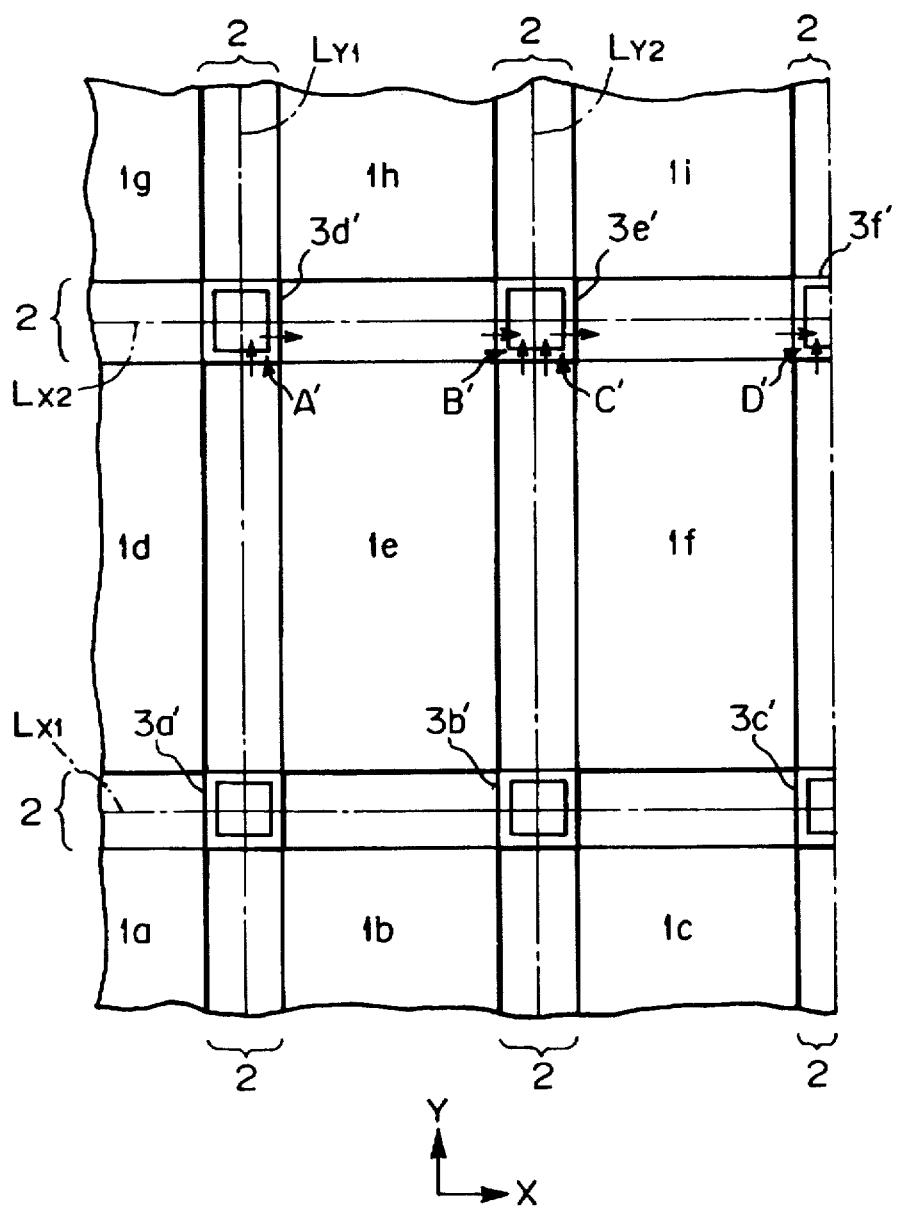
FIG. 6 is a layout diagram illustrating a second prior art semiconductor device.

In FIG. 6, which illustrates a second prior art semiconductor device (wafer), a plurality of rectangular strip-shaped alignment marks $3a'$, $3b'$, ..., $3f'$ are provided instead of the cross-type alignment marks $3a$, $3b$, ..., $3f$ of FIG. 1.

A chip alignment for each chip is carried out by scanning a laser beam on two alignment marks, particularly, two quadrantal segments. For example, a chip alignment for the chip area $1e$ is carried out as follows. First, the lower-right side quadrantal segment of the alignment mark $3d'$ is scanned with a laser beam as indicated by an arrow along the X direction and as indicated by an arrow along the Y direction to obtain a location A' of the lower-right side quadrantal segment of the alignment mark $3d'$. Next, the lower-left side quadrantal segment of the alignment mark $3e'$ is scanned with a laser beam as indicated by an arrow along the X direction and as indicated by an arrow along the Y direction to obtain a location B' of the lower-left side quadrantal segment of the alignment mark $3e'$. From comparison of the locations A' and B' with reference locations, an X direction deviation, a Y direction deviation and a gradient deviation of the chip area $1e$ can be obtained, and as a result, correction of deflection of an electron beam or the like can be carried out in accordance with the X direction deviation, the Y direction deviation and the gradient deviation.

In the outermost chip area such as $1f$ of FIG. 6, even if some segments of the alignment mark $3f$ are lacking, it is possible to calculate an accurate location of the alignment mark $3f'$.

Figure 7:
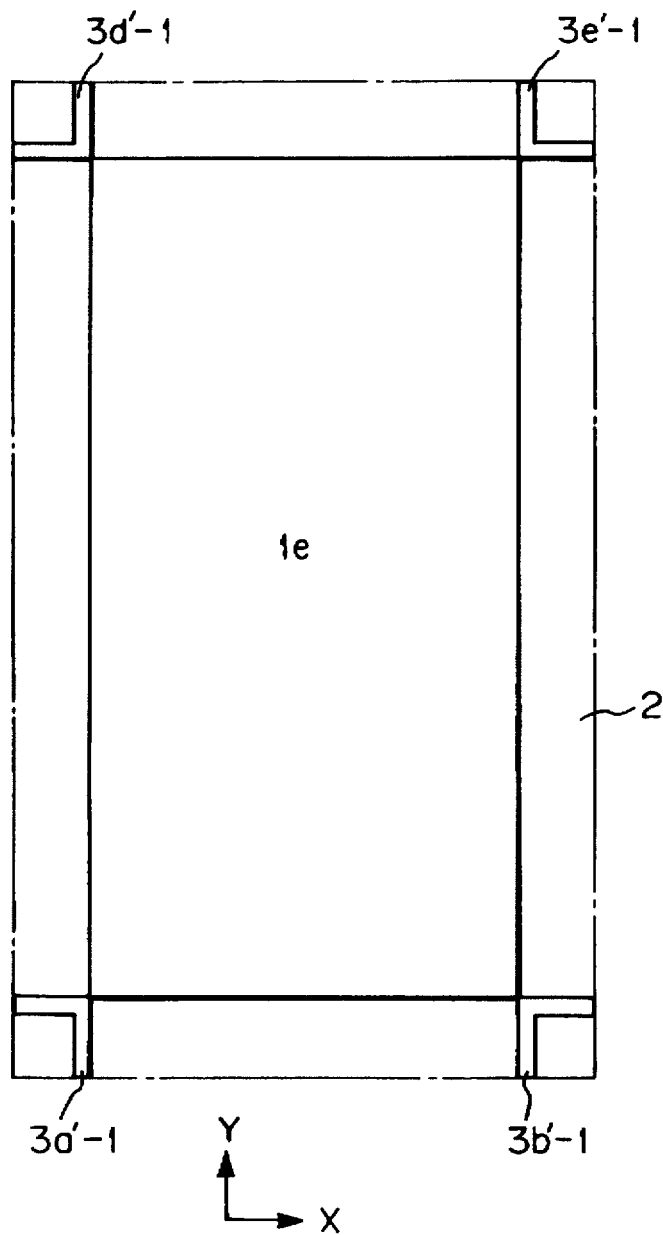
FIG. 7 is a layout diagram of one exposure unit of the device of FIG. 6.

In FIG. 7, which illustrates one exposure unit of the device of FIG. 6, the exposure unit is comprised of one chip area such as 1e and four quadrantal segments of alignment marks such as a quadrantal segment 3a'-1 of the alignment mark 3a', a quadrantal segment 3b'-1 of the alignment mark 3b', a quadrantal segment 3d'-1 of the alignment mark 3d', and a quadrantal segment 3e'-1 of the alignment mark 3e'.

Figure 8:
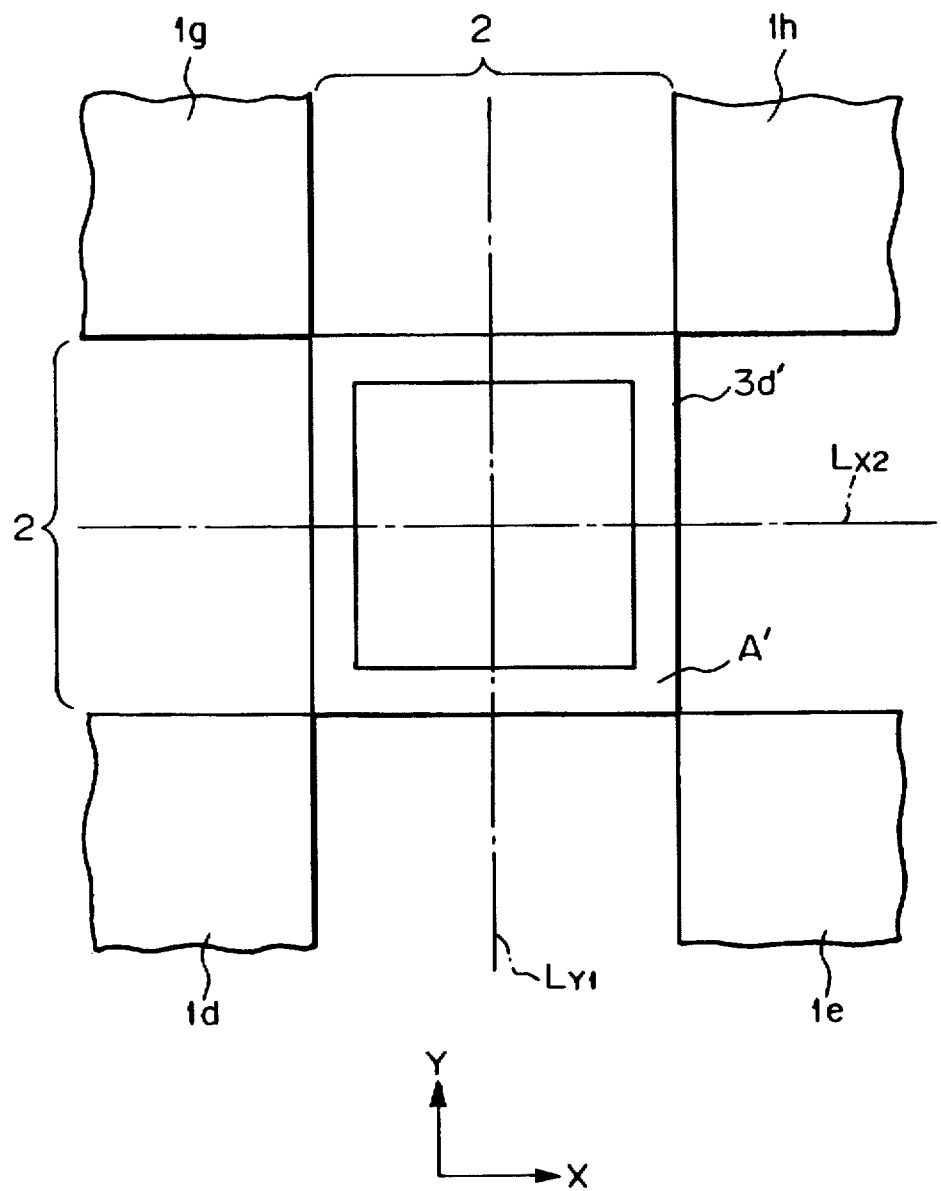
FIG. 8 is a partly-enlarged layout diagram of the alignment mark and its neighborhood of FIG. 6.
Figure 9A:
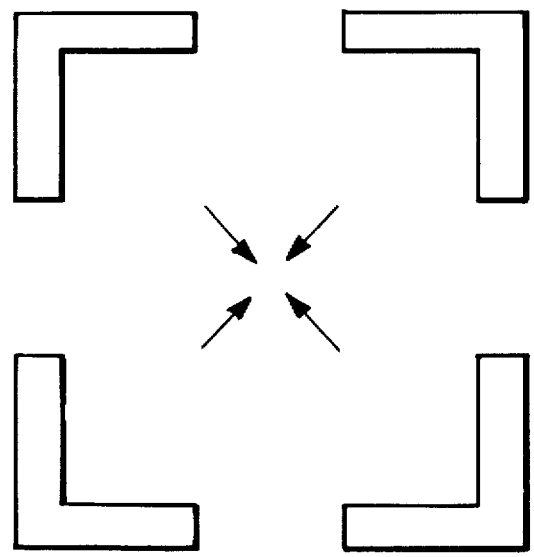
FIGS. 9A and 9B are diagrams for explaining the segments of the alignment of FIG. 8.
Figure 9B:
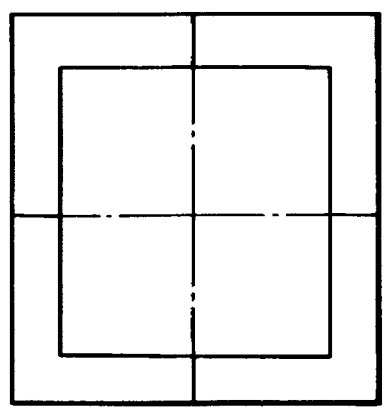

In FIG. 8, which is an enlarged diagram of one alignment mark such as 3d' of FIG. 6, the alignment mark 3d' is located at an intersection between the center line $L_{x2}$ and the center line $L_{y1}$. The alignment mark 1d' is formed by assembling four quadrantal segments as illustrated in FIG. 9A into one rectangular strip-shaped mark as illustrated in FIG. 9B.

Figure 10:
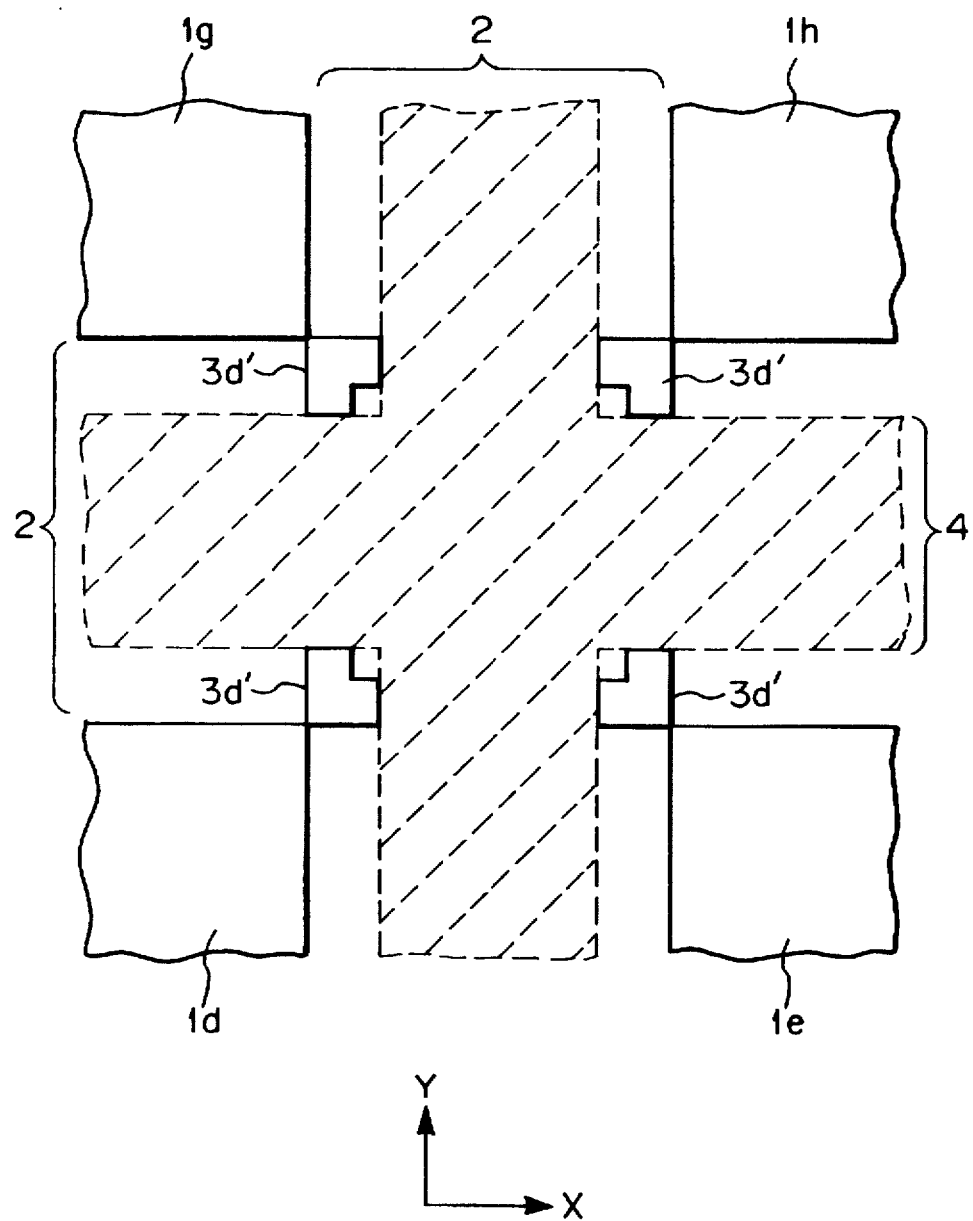
FIG. 10 is a layout diagram of the alignment mark and its neighborhood of FIG. 8 after a dicing operation is carried out.

In FIG. 10, which illustrates the device of FIG. 8 after a dicing operation is carried out, a dicing area 4 is removed; however, in this case, the alignment mark such as 3d' of FIG. 8 is not completely removed. Therefore, there is anxiety about a short-circuit between the remaining parts of the alignment marks and bonding wires.

Figure 11:
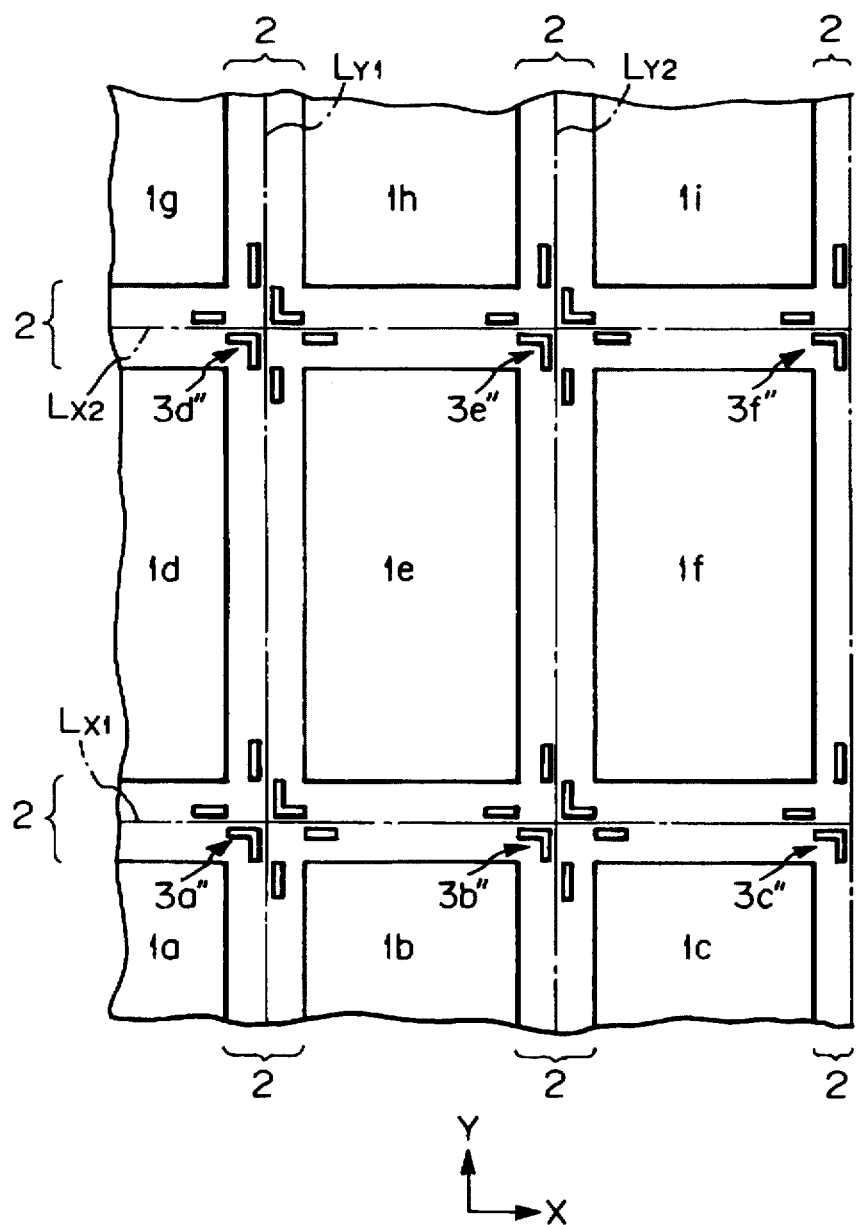
FIG. 11 is a layout diagram illustrating a first embodiment of the semiconductor device according to the present invention.

In FIG. 11, which illustrates a first embodiment of the present invention, L-I type alignment marks 3a", 3b", . . . , 3f" are provided at intersections between center lines $L_{x1}$, $L_{x2}$, . . . of the scribe area 2 along the X direction and center lines $L_{y1}$, $L_{y2}$, . . . of the scribe area 2 along the Y direction.

Figure 12:
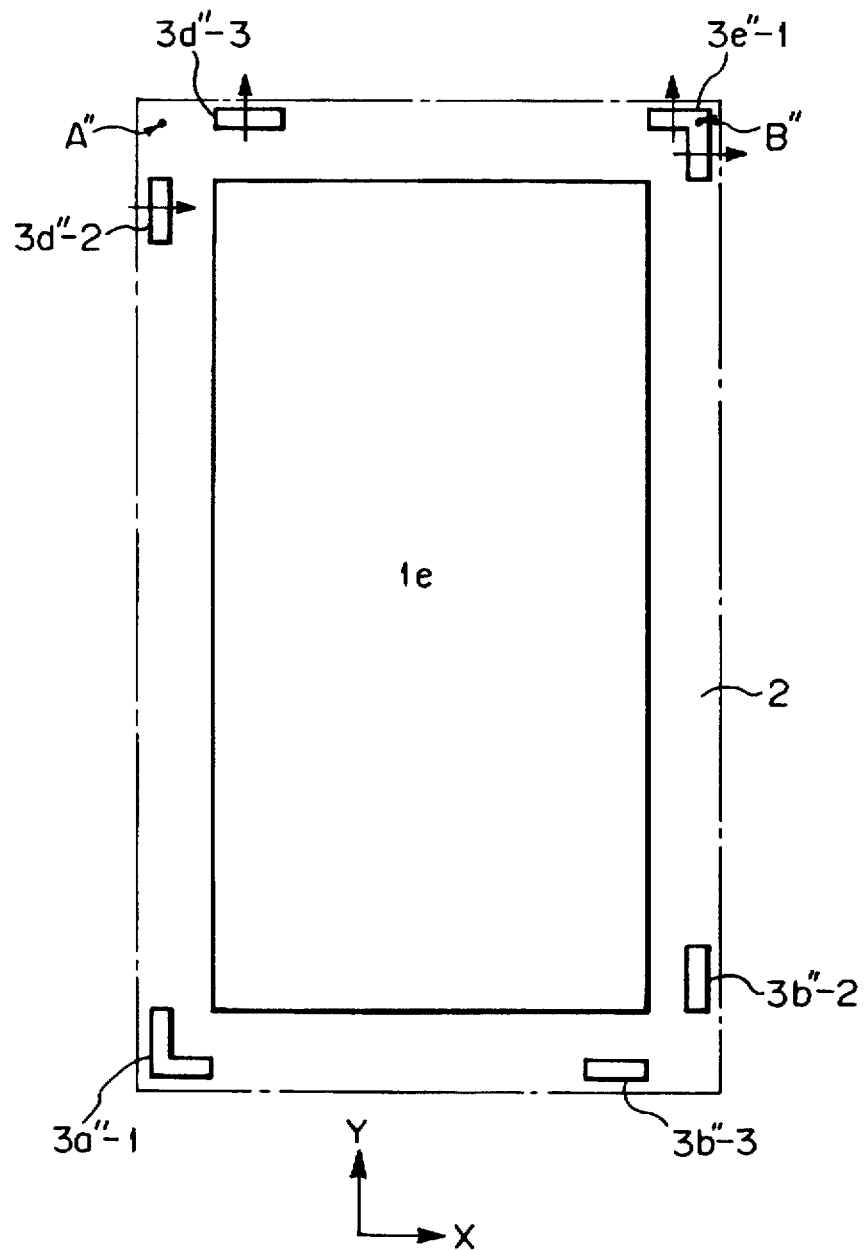
FIG. 12 is a layout diagram of one exposure unit of the device of FIG. 11.

In FIG. 12, which illustrates one exposure unit of the device of FIG. 11, the exposure unit is comprised of one chip area such as 1e and four quadrantal segments of alignment marks. For example, the alignment mark 3a" has an L-shaped alignment segment 3a"-1, the alignment mark 3b" has two I-shaped alignment segments 3b"-2 and 3b"-3, the alignment mark 3d" has two I-shaped alignment segments 3d"-2 and 3d"-3, and the alignment mark 3e" has an L-shaped alignment segment 3e"-1.

A chip alignment for each chip is carried out by scanning a laser beam on two alignment marks, particularly, two quadrantal segments. For example, a chip alignment for the chip area 1e is carried out as follows. First, the I-shaped alignment segments 3d"-2 and 3d"-3 of the alignment mark 3d" are scanned with a laser beam as indicated by an arrow along the X direction and as indicated by an arrow along the Y direction to obtain a location A" of the lower-right side quadrantal segment of the alignment mark 3d". Next, the L-shaped alignment segment 3e"-1 of the alignment mark 3e" is scanned with a laser beam as indicated by an arrow along the X direction and as indicated by an arrow along the Y direction to obtain a location B" of the lower-left side quadrantal segment of the alignment mark 3e". From comparison of the locations A" and B" with reference locations, an X direction deviation, a Y direction deviation and a gradient deviation of the chip area 1e" can be obtained. As a result, correction of deflection of an electron beam, correction of the location of probes in a wafer testing step, correction of the location of a laser beam in a laser trimming step, and correction of alignment of cutting blades in a dicing step can be carried out in accordance with the X direction deviation, the Y direction deviation and the gradient deviation.

Figure 13A:
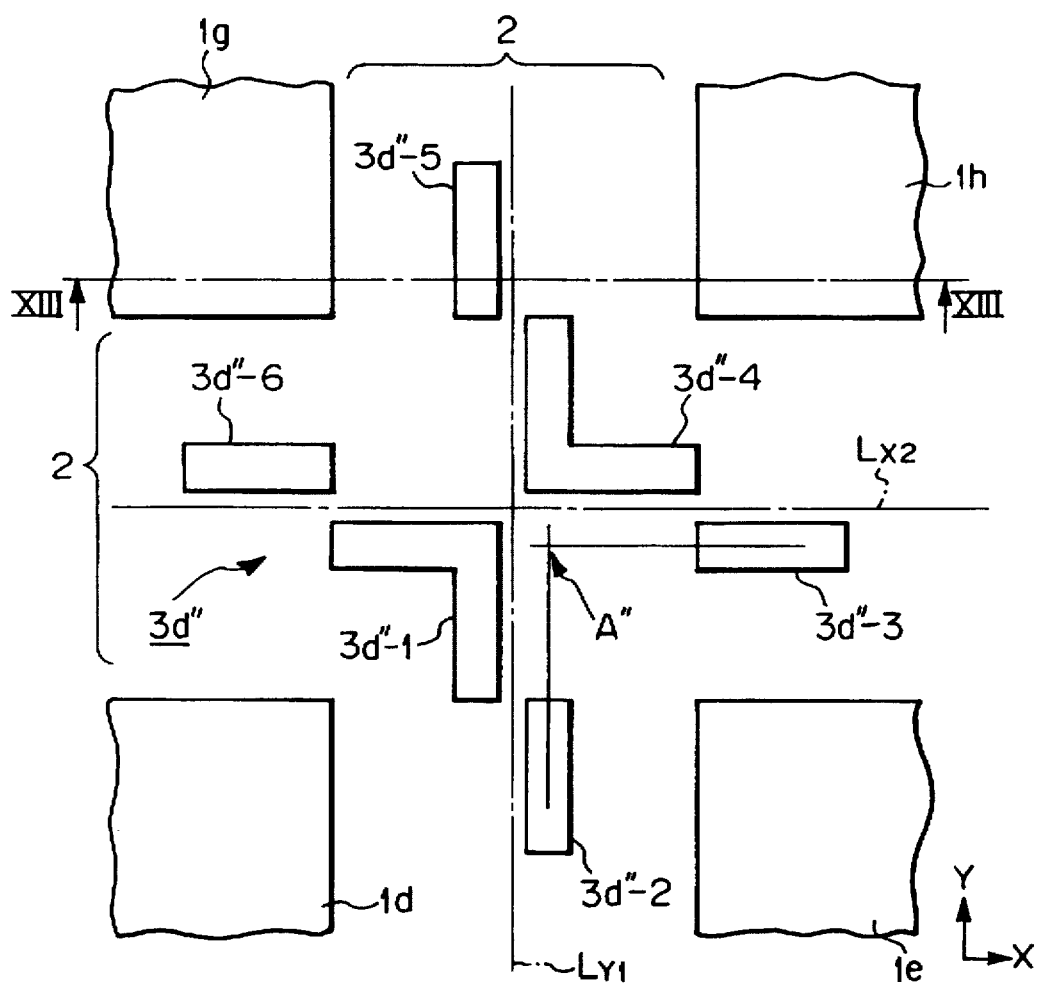
FIG. 13A is a partly-enlarged layout diagram of the alignment mark and its neighborhood of FIG. 11.
Figure 14A:
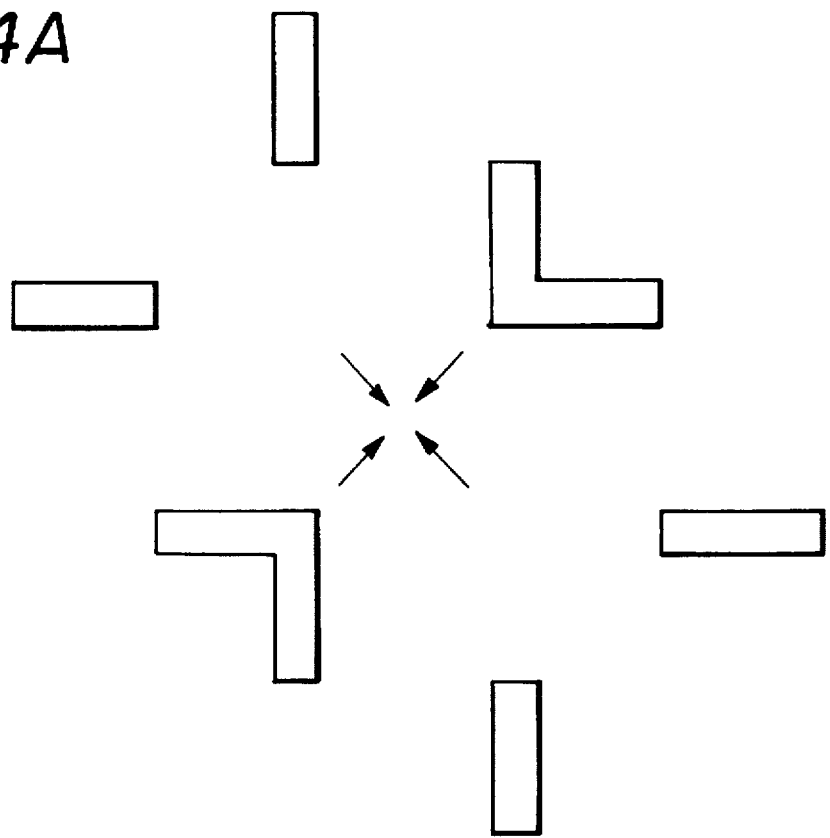
FIGS. 14A and 14B are diagrams for explaining the segments of the alignment of FIG. 13.
Figure 14B:
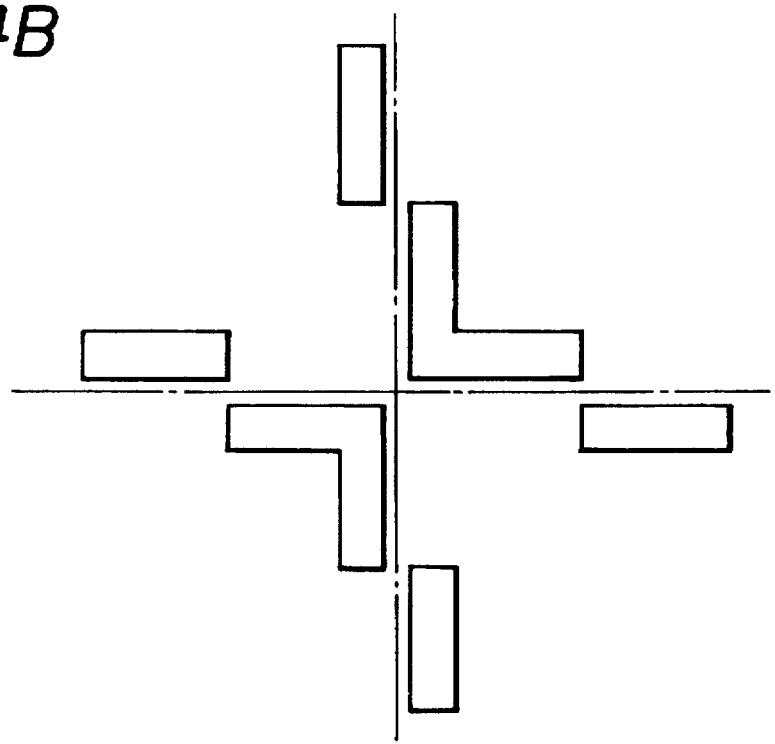

In FIG. 13A, which is an enlarged diagram of one alignment mark such as 3d of FIG. 11, the alignment mark 3d" is located at an intersection between the center line $L_{x2}$ and the center line $L_{y1}$. The alignment mark 1d" is formed by assembling four quadrantal segments as illustrated in FIG. 14A into one alignment mark as illustrated in FIG. 14B.

Figure 13B:
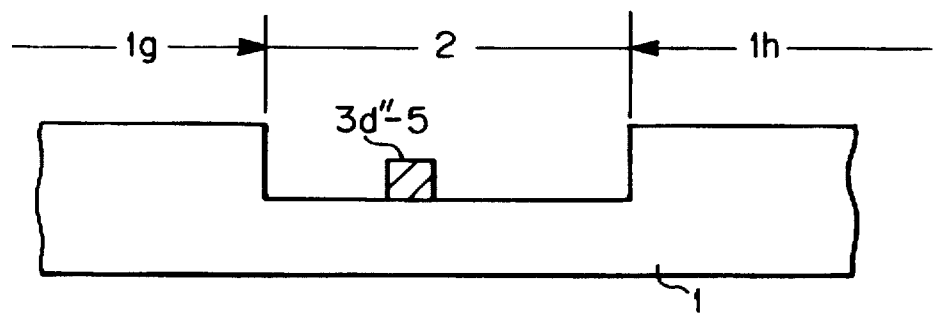
FIG. 13B is a cross-sectional view taken along the line X III—X III of FIG. 13A.

As illustrated in FIG. 13B, which is a cross-sectional view taken along the line X III—X III of FIG. 13A, the alignment marks are made of the same metal as a metal connection layer.

Also, as illustrated in FIG. 13A, dead spaces are required both sides of each of the L-shaped alignment segments 3d"-1 and 3d"-4 and the I-shaped alignment segments 3d"-2, 3d"-3, 3d"-5 and 3d"-6, thus surely enabling scanning of the alignment segments with a laser beam. In other words, none of the I-shaped alignment segments ever face the L-shaped alignment segments. For example, the I-shaped alignment segment 3d"-2 is shifted down along the Y direction with respect to the L-shaped alignment segment 3d"-1.

Figure 15:
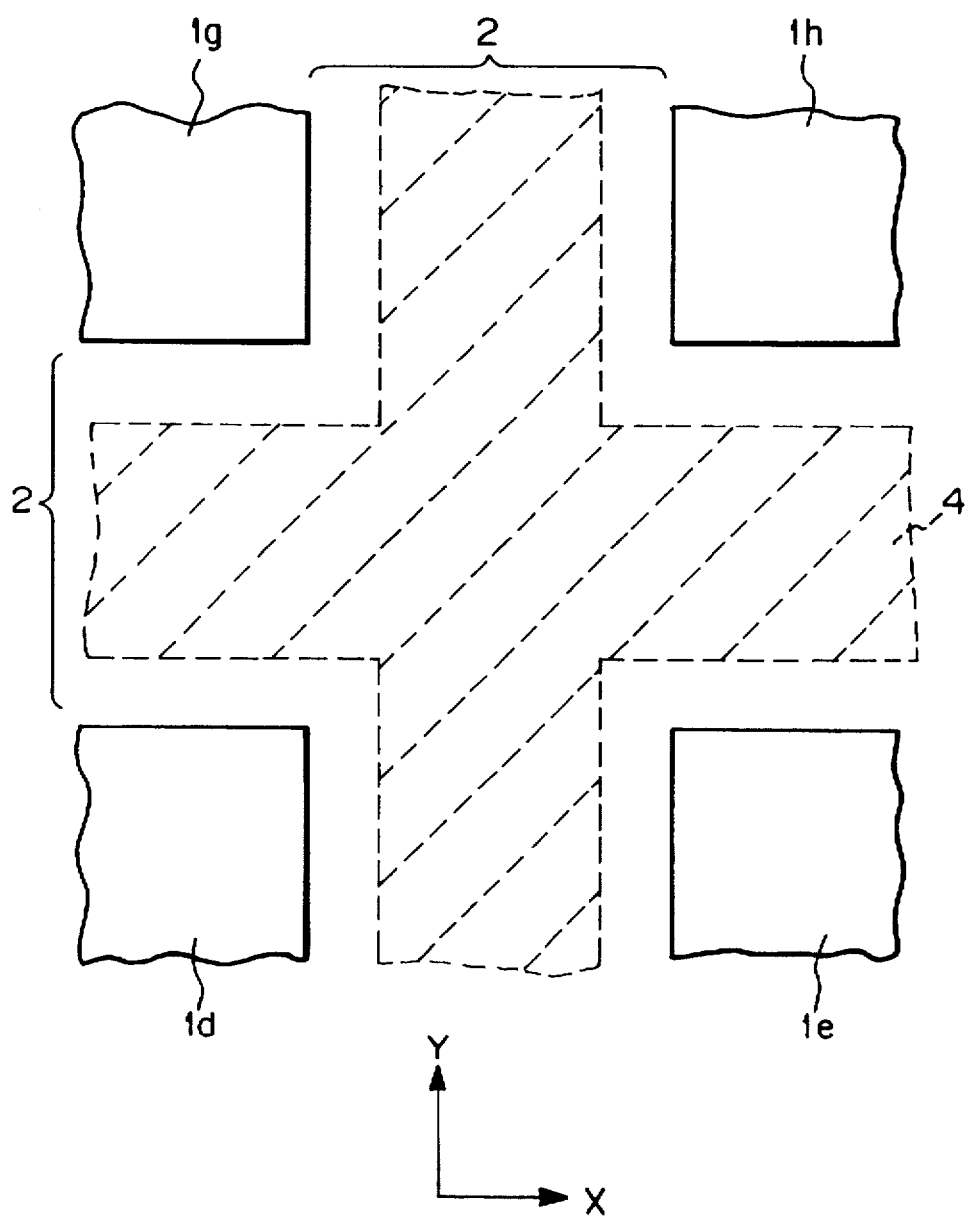
FIG. 15 is a layout diagram of the alignment mark and its neighborhood of FIG. 13 after a dicing operation is carried out.

In FIG. 15, which illustrates the device of FIG. 13 after a dicing operation is carried out, a dicing area 4 is removed, and accordingly, the alignment mark such as 3d" of FIG. 13 is completely removed. In this case, note that the scribe area 2 is about 100 µm wide and the dicing area 4 is about 80 µm wide. Therefore, there is no anxiety about a short-circuit between the remaining parts of the alignment marks and bonding wires.

In the outermost chip area such as 1f of FIG. 11, even if some segments of the alignment mark 3f" are lacking, it is possible to calculate an accurate location of the alignment mark 3f".

Next, the sizes of the L-shaped alignment segments and the I-shaped alignment segments will be discussed with reference to FIGS. 16, 17A, 17B, 17C, 18A and 18B.

Figure 16:
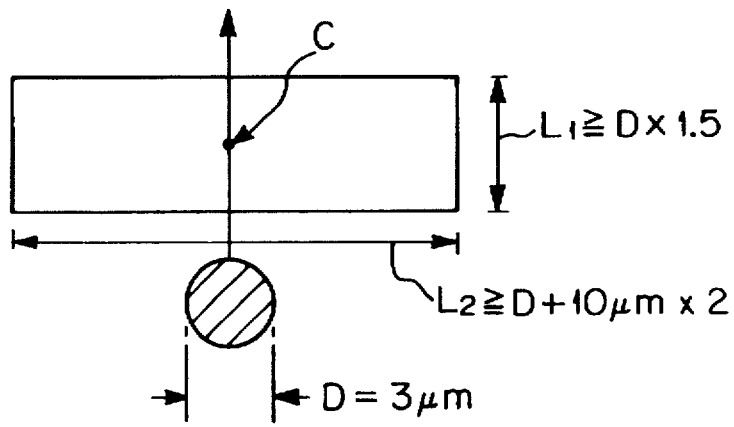
FIG. 16 is a diagram for explaining a size of a rectangular alignment segment.

In FIG. 16, assume that a rectangular alignment segment having a size of $L_1 \times L_2$ is scanned with a laser beam having a radius D such as 3 µm. In this case, in order to obtain an optimum light reflectance from the alignment segment, the length $L_2$ has to satisfy the following:

$$L_2 \geq D + (10\,\mu m \times 2) \qquad (2)$$
$$= 23\,\mu m$$

Figure 17A:
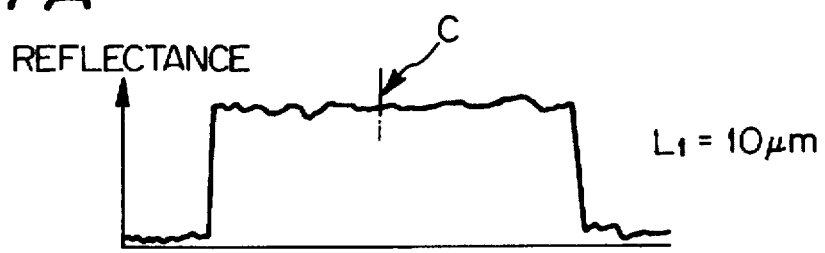
FIGS. 17A, 17B and 17C are graphs showing light reflectance characteristics of the rectangular alignment segment of FIG. 16.
Figure 17B:
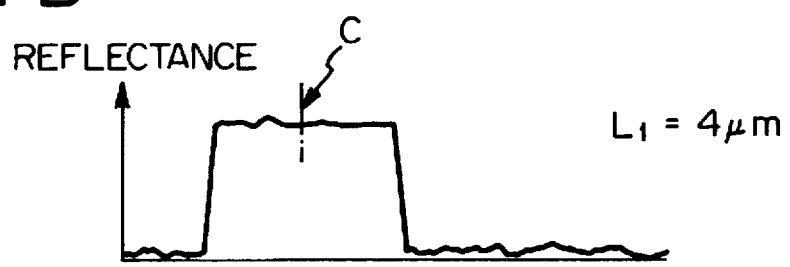
Figure 17C:
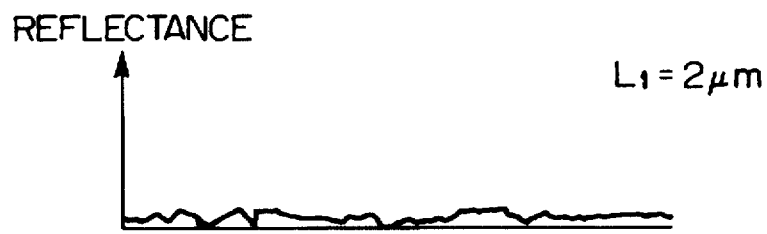

For example, if $L_1$=10 µm, light reflectance from the alignment mark as shown in FIG. 17A by a laser beam scanning operation is obtained, and accordingly, it is easy to calculate a center location C of the alignment segment. Also, if $L_1$=4 µm, light reflectance from the alignment mark as shown in FIG. 17B by a laser beam scanning operation is obtained, and accordingly, it is difficult to calculate a center location C of the alignment segment. Further, if $L_2$=2 µm, light reflectance from the alignment mark as shown in FIG. 17C by a laser beam scanning operation is obtained, and accordingly, it is impossible to calculate a center location C of the alignment segment.

Figure 18A:
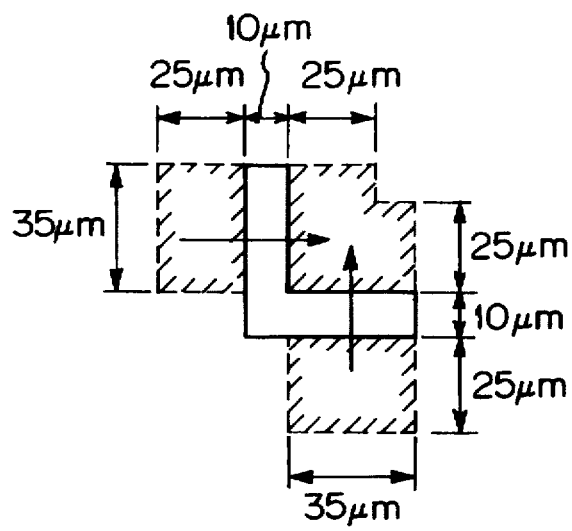
FIG. 18A is a diagram for explaining the size of the L-shaped alignment segment of FIG. 11.
Figure 18B:
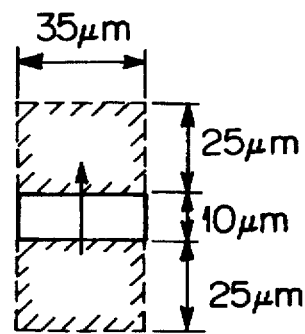
FIG. 18B is a diagram for explaining the size of the I-shaped alignment segment of FIG. 11.

From the formula (1) and (2), if $L_1$=10 µm and $L_2$=35 µm, each of the L-shaped alignment segments is shown as in FIG. 18A, and each of the I-shaped alignments is shown in FIG. 18B. In FIGS. 18A and 18B, note that shaded portions on the sides of the alignment segments indicate dead spaces in which light reflectance is almost zero, thus easily carrying out a laser beam scanning operation.

Figure 19:
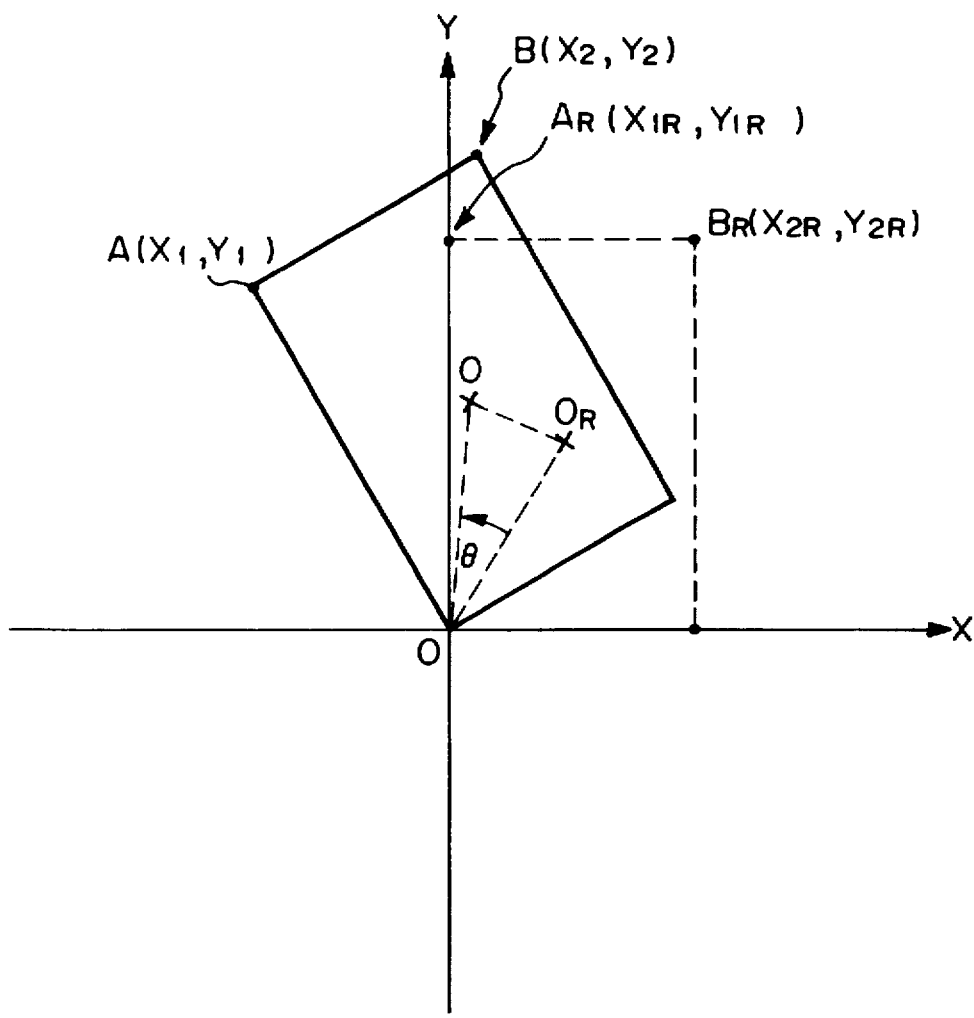
FIG. 19 is a diagram for explaining calculation of an X direction deviation, a Y direction deviation and a gradient deviation of a chip.

In FIG. 19, which is a diagram for explaining calculation of an X direction deviation, a Y direction deviation and a gradient deviation of a chip, assume that reference locations $A_R'(X_{1R}, Y_{1R})$ and $B_R (X_{2R}, Y_{2R})$ are as follows:

$(X_{1R}, Y_{1R})$=(0, 6)

$(X_{2R}, Y_{2R})$=(4, 6)

Also, assume that locations $A(X_1, Y_1)$ and $B(X_2, Y_2)$ are obtained as follows:

$(X_1, Y_1) = (-3, 5.196)$ $(X_2, Y_2) = (0.464, 7.196)$

In this case, an X direction deviation $\Delta X_a$ and a Y direction deviation $\Delta Y_a$ of the location A are $$\begin{aligned} \Delta X_a &= X_1 - X_{1R} = -3 - 0 \\ &= -3 \\ \Delta Y_a &= Y_1 - Y_{1R} = 5.196 - 6 \\ &= -0.804 \end{aligned}$$

Also, an X direction deviation $\Delta X_b$ and a Y direction deviation $\Delta Y_b$ of the location B are $$\begin{aligned} \Delta X_b &= X_2 - X_{2R} = 0.464 - 4 \\ &= -3.536 \\ \Delta Y_c &= Y_2 - Y_{2R} = 7.196 - 6 \\ &= 1.196 \end{aligned}$$

Therefore, an X direction deviation of the center O the chip with respect to a reference center $O_R$ is $$\begin{aligned} (\Delta X_a + \Delta X_b)/2 &= (-3 - 3.536)/2 \\ &= -3.268 \end{aligned}$$

Also, a Y direction deviation of the center O the chip with respect to the reference center $O_R$ is $$\begin{aligned} (\Delta Y_a + \Delta Y_b)/2 &= (-0.804 + 1.196)/2 \\ &= 0.316 \end{aligned}$$

Further, a gradient deviation $\theta$ of the chip is $$\begin{aligned} \theta &= \cos^{-1} \\ & \quad (\sqrt{(-3)^2 + (-0.804)^2} \ / \sqrt{(-3.536)^2 + (1.196)^2} \ ) \\ &= \cos^{-1}(3.106/3.733) \\ &= 33.7. \end{aligned}$$

Figure 20:
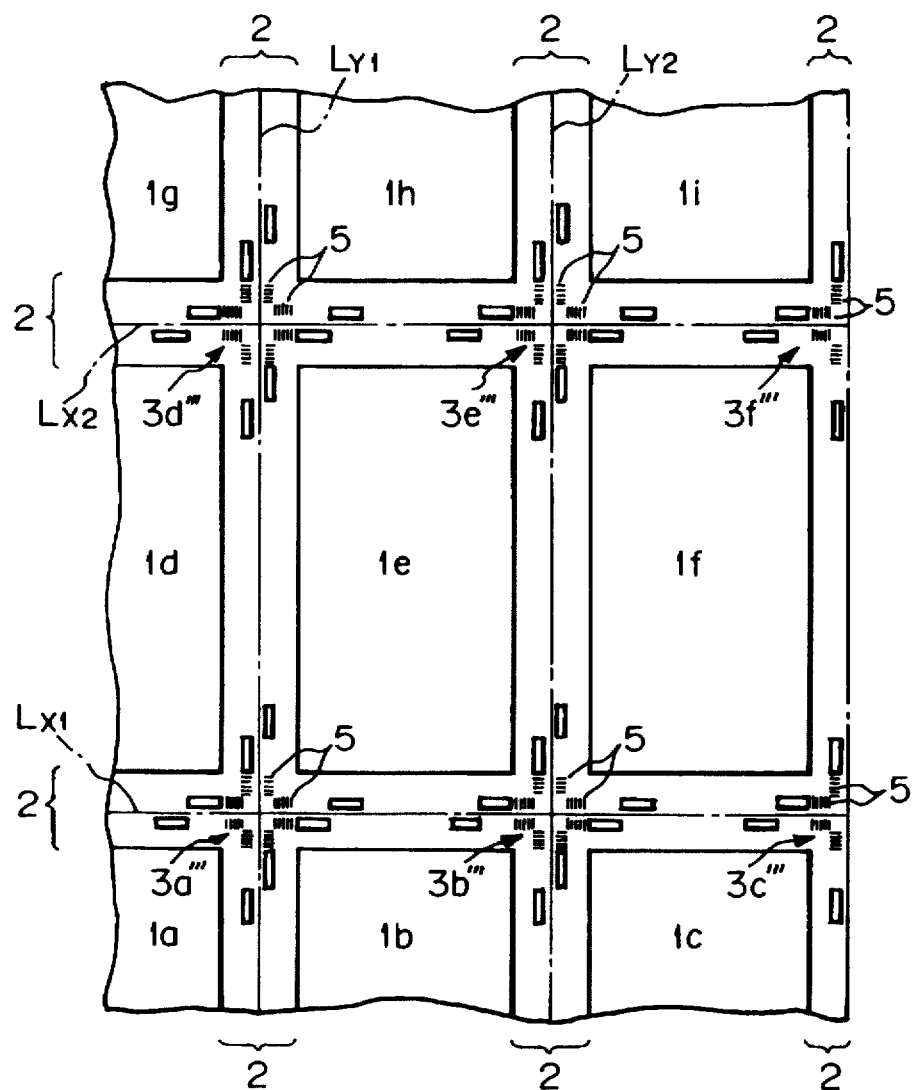
FIG. 20 is a layout diagram illustrating a second embodiment of the semiconductor device according to the present invention.

In FIG. 20, which illustrates a second embodiment of the present invention, dicing alignment marks, i.e., diffraction gratings 5 are provided at intersections between center lines $L_{X1}, L_{X2}, \ldots$ of the scribe area 2 along the X direction and center lines $L_{Y1}, L_{Y2}, \ldots$ of the scribe area 2 along the Y direction. As a result, I—I type alignment marks $3a'''$, $3b'''$, $\ldots 3f'''$ are provided instead of the L-type alignment marks $3a''$, $3b''$, $\ldots$, $3f''$ of FIG. 11.

Figure 21:
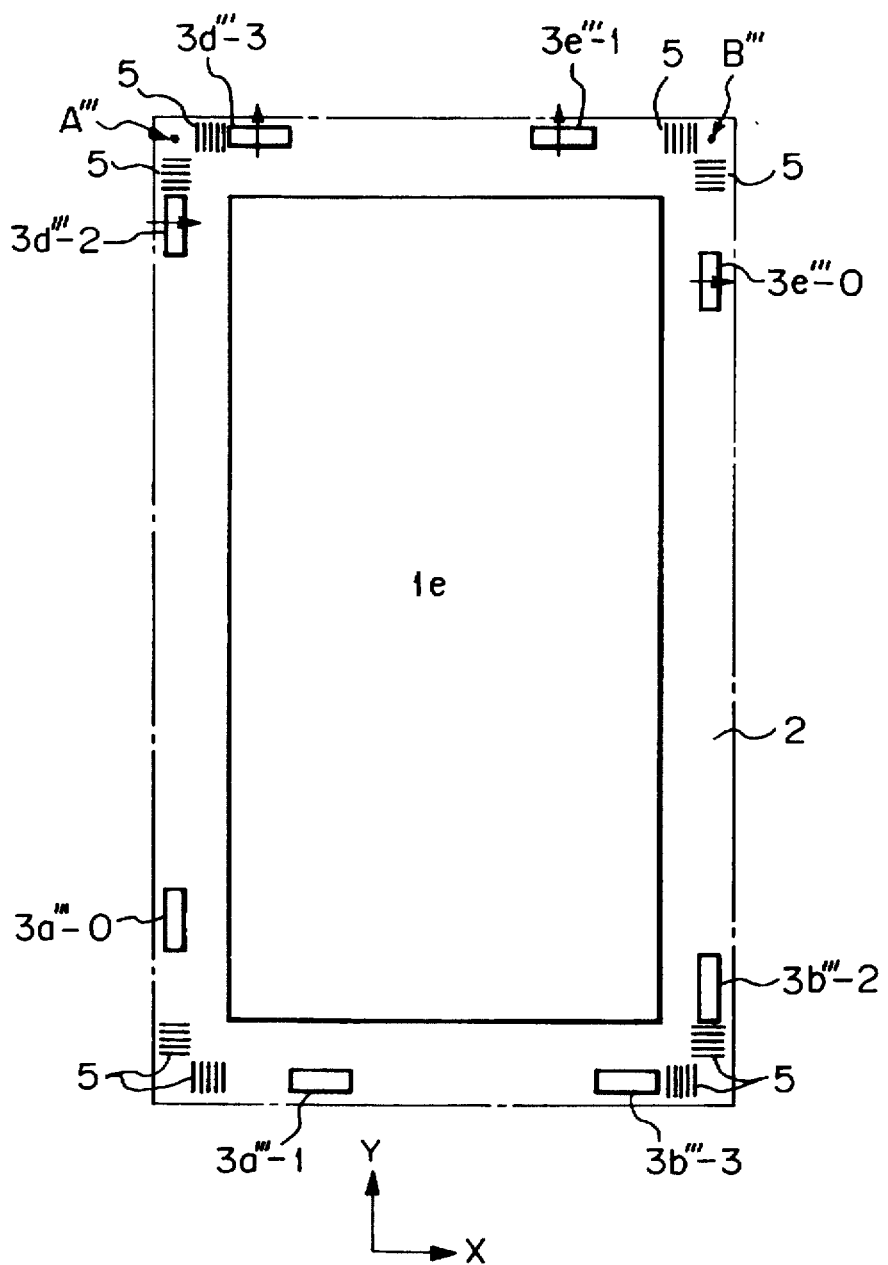
FIG. 21 is a layout diagram of one exposure unit of the device of FIG. 20.

In FIG. 21, which illustrates one exposure unit of the device of FIG. 20, the exposure unit is comprised of one chip area such as 1e and four quadrantal segments of alignment marks. For example, the alignment mark $3a'''$ has two I-shaped alignment segments $3a'''$-0 and $3a'''$-1, the alignment mark $3b'''$ has two I-shaped alignment segments $3b'''$-2 and $3b'''$-3, the alignment mark $3d'''$ has two I-shaped alignment segments $3d'''$-2 and $3d'''$-3, and the alignment mark $3e'''$ has two I-shaped alignment segments $3e'''$-0 and $3e'''$-1.

A chip alignment for each chip is carried out by scanning a laser beam on two alignment marks, particularly, two quadrantal segments. For example, a chip alignment for the chip area 1e is carried out as follows. First, the I-shaped alignment segments $3d'''$-2 and $3d'''$-3 of the alignment mark $3d'''$ are scanned with a laser beam as indicated by an arrow along the X direction and as indicated by an arrow along the Y direction to obtain a location A''' of the lower-right side quadrantal segment of the alignment mark $3d'''$. Next, the I-shaped alignment segments $3e'''$-0 and $3e'''$-1 of the alignment mark $3e'''$ are scanned with a laser beam as indicated by an arrow along the X direction and as indicated by an arrow along the Y direction to obtain a location B''' of the lower-left side quadrantal segment of the alignment mark $3e'''$. From comparison of the locations A''' and B''' with reference locations, an X direction deviation, a Y direction deviation and a gradient deviation of the chip area 1e''' can be obtained. As a result, correction of deflection of an electron beam, correction of the location of probes in a wafer testing step, correction of the location of an laser beam in a laser trimming step, and correction of alignment of cutting blades in a dicing step can be carried out in accordance with the X direction deviation, the Y direction deviation and the gradient deviation.

Figure 22:
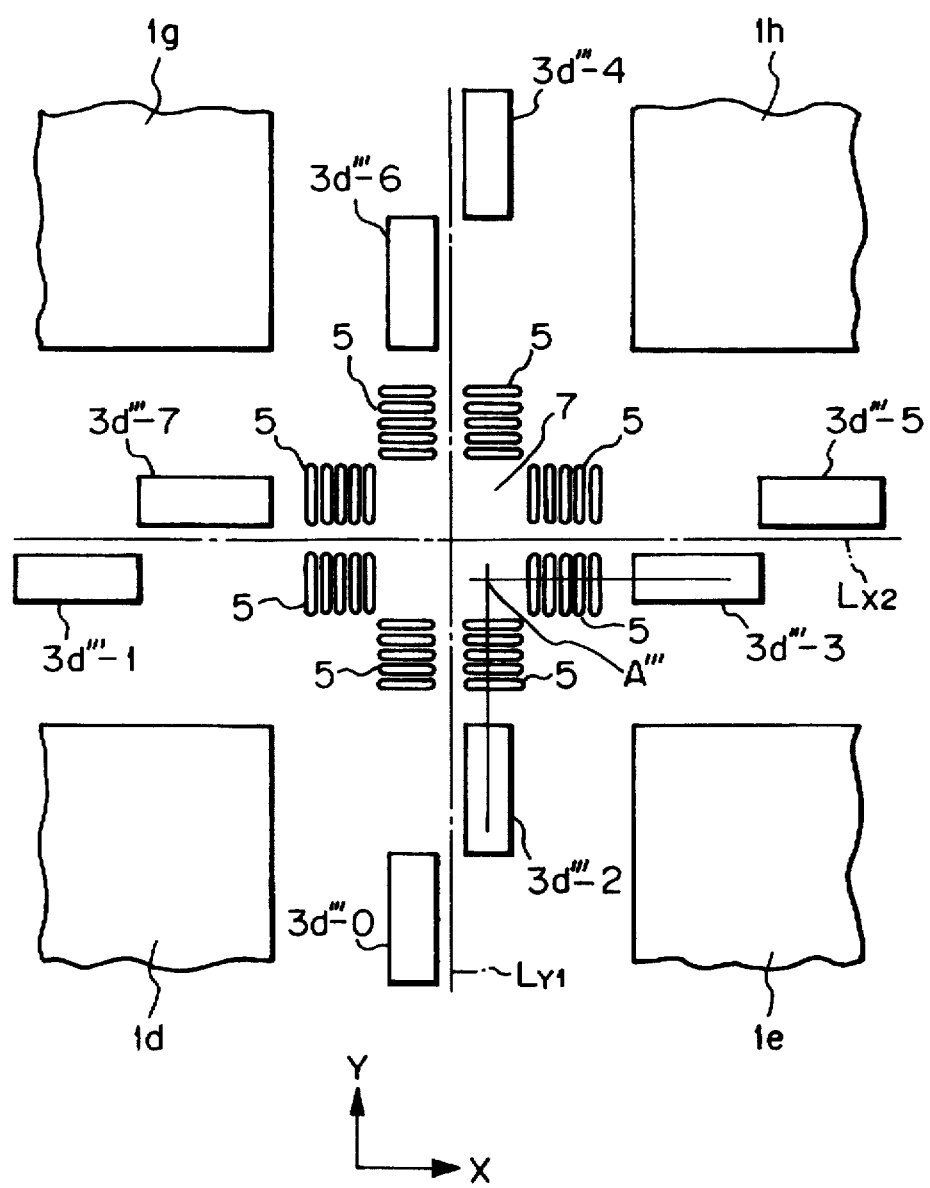
FIG. 22 is a partly-enlarged layout diagram of the alignment mark and its neighborhood of FIG. 20.

In FIG. 22, which in an enlarged diagram of one alignment mark such as $3d'''$ of FIG. 20, the alignment mark $3d'''$ is located at an intersection between the center line $L_{X2}$ and the center line $L_{Y1}$. The alignment mark $1d'''$ is formed by assembling four quadrantal segments as illustrated in FIG. 23A into one alignment mark as illustrated in FIG. 23B.

Figure 23A:
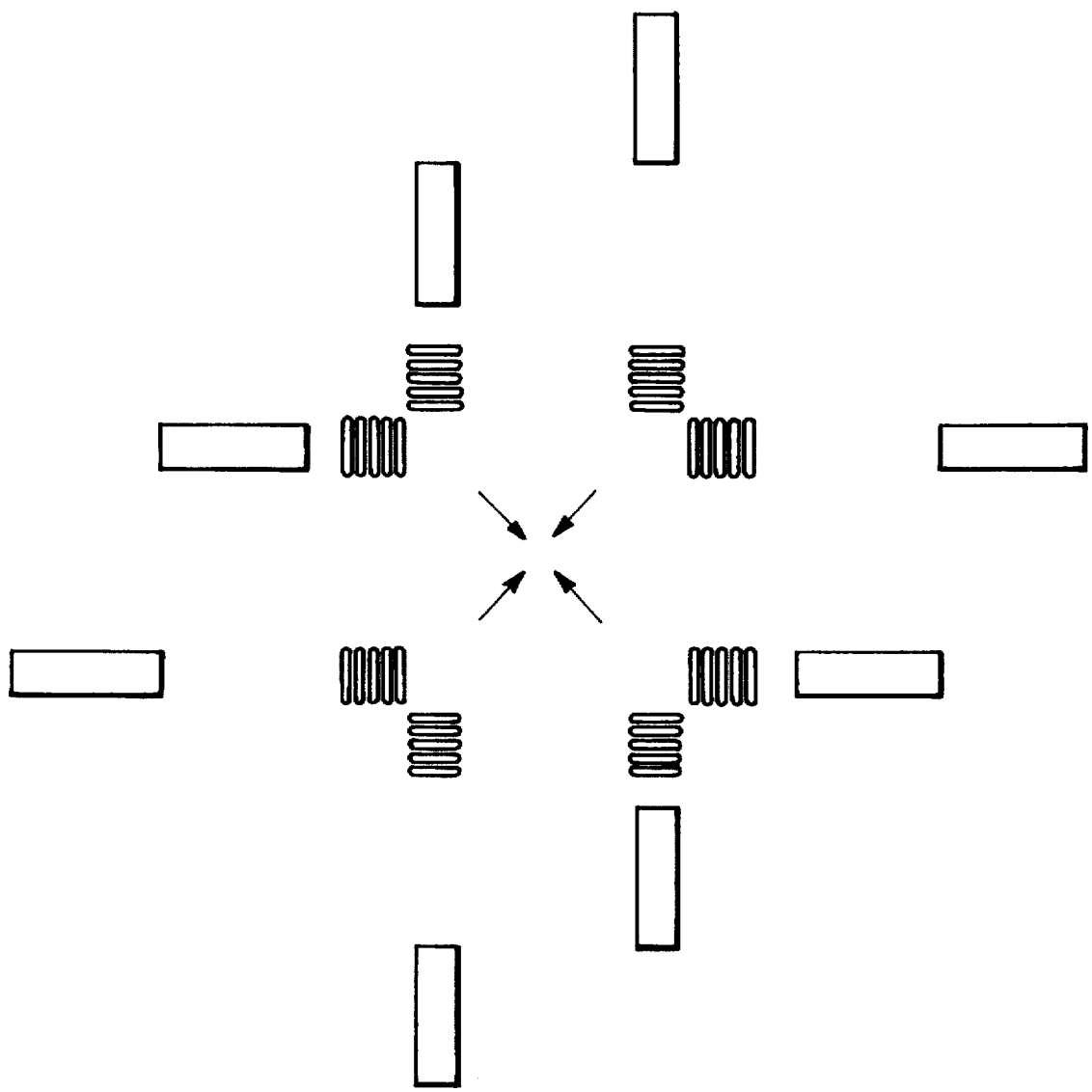
FIGS. 23A and 23B are diagrams for explaining the segments of the alignment of FIG. 22.
Figure 23B:
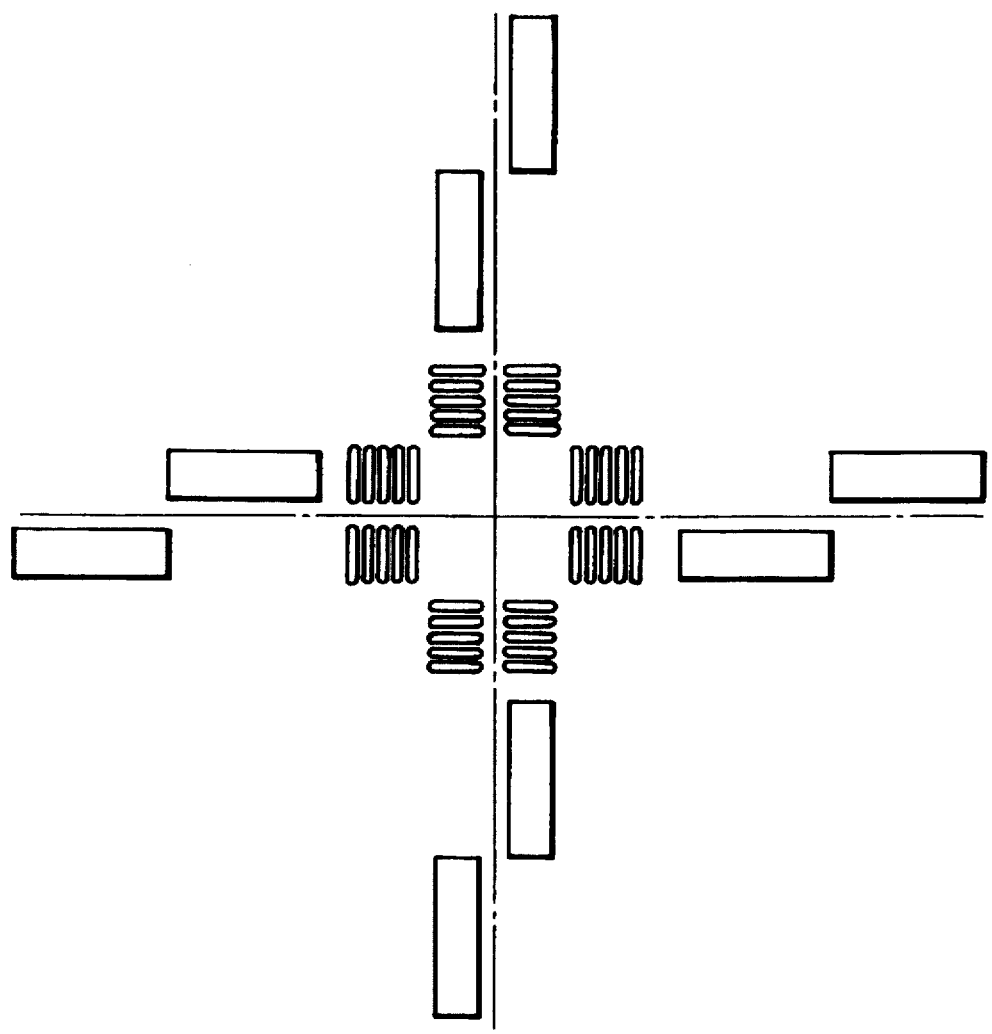

Also, as illustrated in FIG. 23A, dead spaces are required on both sides of each of the I-shaped alignment segments $3d'''$-0, $3d'''$-1, $3d'''$-3, $3d'''$-4, $3d'''$-5, $3d'''$-6 and $3d'''$-7, thus surely enabling scanning the alignment segments with a laser beam. In other together words, none of the I-shaped alignment segments ever face the I-shaped alignment segments. For example, the I-shaped alignment segment $3d'''$-0 is shifted down along the Y direction with respect to the L-shaped alignment segment $3d'''$-2.

Figure 24:
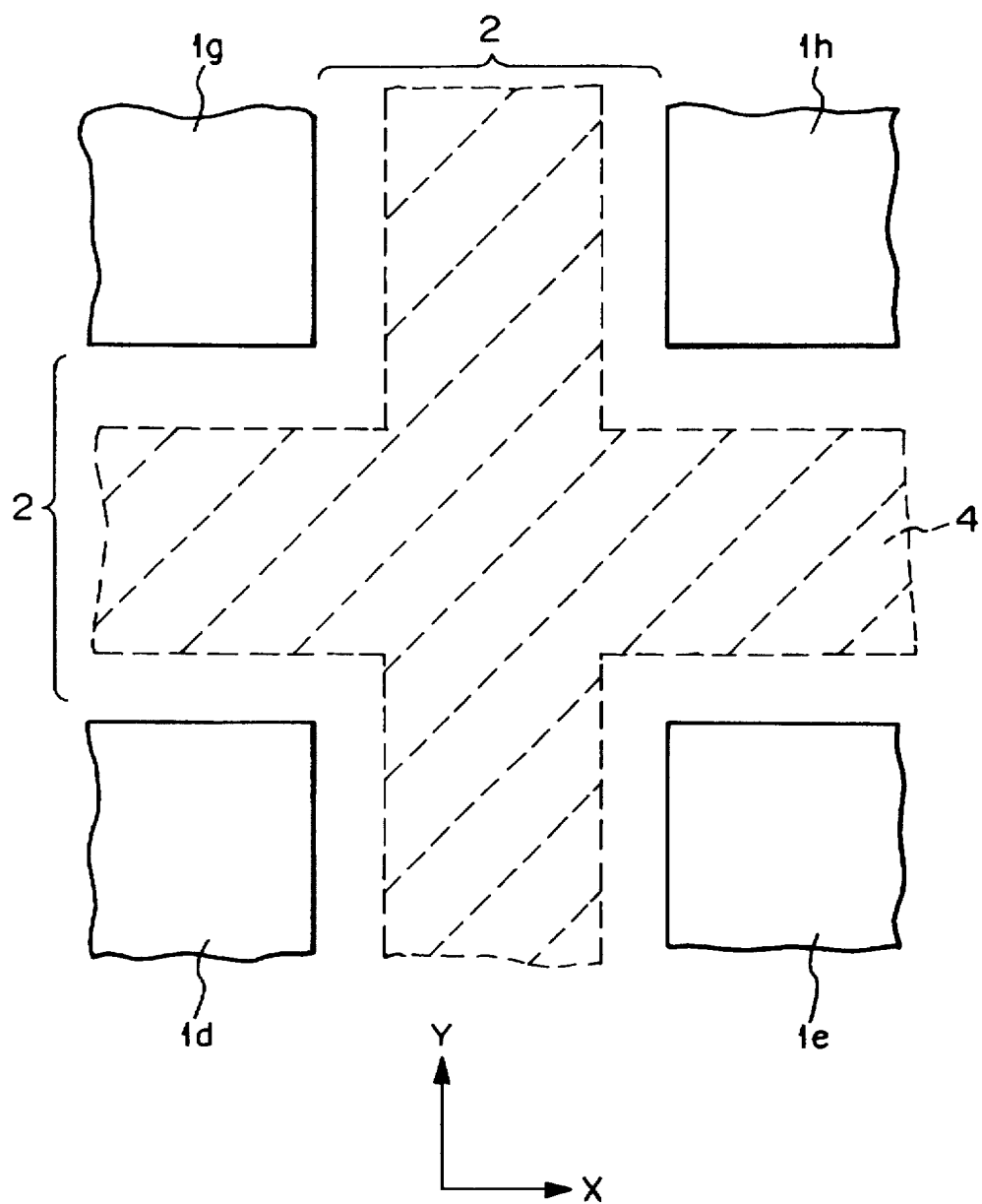
FIG. 24 is a layout diagram of the alignment mark and its neighborhood of FIG. 22 after a dicing operation is carried out.

In FIG. 24, which illustrates the device of FIG. 22 after a dicing operation is carried out, a dicing area 4 is removed, and accordingly,-the alignment mark such as $3d'''$ of FIG. 22 is completely removed. Therefore, there is no anxiety about a short-circuit between the remaining parts of the alignment marks and bonding wires.

In the outermost chip area such as if of FIG. 20, even if some segments of the alignment mark $3f'''$ are lacking, it is possible to calculate an accurate location of the alignment mark $3f'''$.

As explained hereinbefore, according to the present invention, chip alignment can he effectively carried out for outermost chips, and also a short circuit between alignment marks and bonding wire can be avoided.

I claim:

1. A semiconductor device comprising:

a plurality of chip areas arranged in a matrix along an X direction and a Y direction;

a grid-like scribe area partitioning said chip areas, a dicing area being defined within said scribe area;

a plurality of L-shaped alignment segments, each located within one of first quadrants defined by first center lines of said scribe area along said X direction and second center lines of said scribe area along said Y direction; and a plurality of pairs of I-shaped alignment segments, each pair being located within one of second quadrants defined by said first center lines and second center lines, said second quadrants being adjacent to said first quadrants, said L-shaped alignment segments and said I-shaped alignment segments being located within said dicing area.

2. The device as set forth in claim 1, wherein a dead space is provided on both sides of each of said L-shaped alignment segments and said I-shaped alignment segments.

3. The device as set forth in claim 1, wherein said I-shaped alignment segments are more distant than said L-shaped alignment segments with respect to intersections between said first center lines and said second center lines.

4. The device as set forth in claim 1, wherein each center location detected by scanning said L-shaped alignment segments with a light beam and each center location detected by scanning said pairs of I-shaped alignment segments with a light beam are all located within said dicing area.

5. A semiconductor device comprising:

a plurality of chip areas arranged in a matrix along an X direction and a Y direction;

a grid-like scribe area partitioning said chip areas, a dicing area being defined within said scribe area;

a plurality of diffraction grating alignment segments, each located within one of quadrants defined by first center lines of said scribe area along said X direction and second center lines of said scribe area along said Y direction; and a plurality of pairs of I-shaped alignment segments, each pair being located within one of said quadrants, said diffraction grating alignment segments and said I-shaped alignment segments being located within said dicing area.

6. The device as set forth in claim 5, wherein a dead space is provided on both sides of each of said I-shaped alignment segments.

7. The device as set forth in claim 5, wherein said I-shaped alignment segments are more distant than said diffraction grating alignment segments with respect to intersections between said first center lines and said second center lines.

8. The device as set forth in claim 1, wherein each center location detected by scanning said pairs of I-shaped alignment segments with a light beam is located within said dicing area.

* * * * *

UNITED STATES PATENT AND TRADEMARK OFFICE
CERTIFICATE OF CORRECTION

PATENT NO.   : 5,777,392
DATED        : July 7, 1998
INVENTOR(S)  : Hideki FUJII It is certified that error appears in the above-identified patent and that said Letters Patent is hereby corrected as shown below:

On the title page, insert Item [30]:    foreign application priority data is missing, please insert --Japan 7-069206 filed March 28, 1995--.

Signed and Sealed this

Eighth Day of June, 1999

Attest:

Q. TODD DICKINSON

*Attesting Officer*    *Acting Commissioner of Patents and Trademarks*